(12) United States Patent
Bolde et al.

(10) Patent No.: US 6,186,216 B1
(45) Date of Patent: Feb. 13, 2001

(54) CAST COLUMN GRID ARRAY EXTRACTION APPARATUS AND METHOD

(75) Inventors: Lannie R. Bolde, New Paltz; James H. Covell II, Pougkeepsie, both of NY (US)

(73) Assignee: International Business Machines Corporation, Armonk, NY (US)

(*) Notice: Under 35 U.S.C. 154(b), the term of this patent shall be extended for 0 days.

(21) Appl. No.: 09/208,791

(22) Filed: Dec. 10, 1998

(51) Int. Cl.$^7$ .............................. B22D 29/00; B23K 35/12
(52) U.S. Cl. ...................... 164/131; 164/347; 228/254; 228/33
(58) Field of Search ................................ 164/131, 347; 228/254, 33

(56) References Cited

U.S. PATENT DOCUMENTS

| | | | |
|---|---|---|---|
| 3,899,282 | 8/1975 | Jesse | 425/444 |
| 4,009,979 | 3/1977 | Martin | 425/107 |
| 4,661,055 | 4/1987 | Thivichon-Prince et al. | 425/556 |
| 5,244,143 | 9/1993 | Ference et al. | 228/180.21 |
| 5,256,364 | 10/1993 | Herbst | 264/334 |
| 5,429,492 | 7/1995 | Taniyama | 425/556 |
| 5,718,361 | * 2/1998 | Braun et al. | 228/56.3 |
| 5,718,367 | 2/1998 | Covell, ll et al. | 228/254 |

* cited by examiner

Primary Examiner—Harold Pyon
Assistant Examiner—Liza Pacheco
(74) Attorney, Agent, or Firm—DeLio & Peterson, LLC; Peter W. Peterson; Aziz M. Ahsan

(57) ABSTRACT

An apparatus for removing a casting comprising an electronic package substrate and an array of cast solder columns having a column pitch of less than 2 mm extending therefrom from the corresponding openings of a mold. The apparatus includes a removable mold containing a plurality of openings for casting a corresponding array of solder columns and bonding the columns to the underside of an electronic package substrate. A stripper plate for receiving the mold contains openings through a thickness thereof corresponding to at least some of the openings in the mold. An ejector assembly including ejector pins having a length at least as long as the sum of the thickness of the stripper plate at the stripper plate openings and the thickness of the mold at the column casting openings, and corresponding to openings in the mold and the stripper plate. The mold and the ejector assembly are relatively movable toward each other to cause at least some of the ejector pins to engage cast columns in the mold openings and push the engaged cast columns and substrate out of the mold. The stripper plate is movable relative to the ejector pins away from the ejector assembly after the ejector pins push the cast columns and substrate out of the mold.

24 Claims, 6 Drawing Sheets

CAST COLUMN GRID ARRAY EXTRACTION APPARATUS AND METHOD

BACKGROUND OF THE INVENTION

1. Field of the Invention

This invention relates to connectors for electrical and microelectronic devices and, in particular, to an apparatus and method for extracting a cast column grid array and bonded substrate from the column grid array mold.

2. Description of Related Art

Cast column grid array (CCGA) connections are used in place of conventional solder balls to electrically connect microprocessors and other electronic components to supporting substrates. With the need for increasing cast column grid array densities, such as recent products having a pitch or column-to column spacing of one millimeter, the process of extracting the CGA substrates from the graphite casting mold becomes more difficult. Present methods for extracting the CCGA substrates from casting molds are labor-intensive, and subject the mold and CCGA product to damage.

Prior art methods specifically directed at CCGA extraction have been tried with only limited success. Using a clamp to pull or unplug the assembly often results in tensile failure of the soft cast pins, as well as imposing a requirement for relief features on the carrier side of the mold that weakens it. The employment of interstitial or edge bearing pins that bear on the carrier have also been tried with limited success due to the lack of clearance between pins and/or part damage from limited bearing surface. Implementation of close tolerance injection molding also eliminates the option of providing clearance holes for extraction within the area of the feature array, since all features in this area will be filled with solder or other casting material. If the extraction forces do not lift the array out in a perpendicular fashion, the cast pins tend to bind in the mold bores. The resulting jamming causes pin and mold damage as well as terminally jamming the cast array in the mold.

Extraction of molded structures by use of multiple ejector pins typically utilize a set of pins integral to the mold structure itself and do not address electronic assemblies. Prior patents such as U.S. Pat. No. 5,429,492 to Taniyama, U.S. Pat. No. 5,236,364 to Herbst, U.S. Pat. No. 4,009,979 to Martin, U.S. Pat. No. 3,899,282 to Jesse, and U.S. Pat. No. 4,661,055 to Prince disclose a variety of pin-type extraction schemes that do not address extraction of remotely filled molds/castings that have been subject to a secondary casting/attachment step.

Accordingly, there is a need for a process and apparatus which overcomes the aforementioned problems and extracts CCGA substrates from the casting mold with very little operator effort, and may further be utilized with automated tooling.

Bearing in mind the problems and deficiencies of the prior art, it is therefore an object of the present invention to provide an improved process and apparatus for extracting from a casting mold.

It is another object of the present invention to provide a CCGA substrate extraction process and apparatus which is less labor-intensive.

A further object of the invention is to provide an extraction process and apparatus which is less susceptible to damaging the CCGA substrate and/or interconnect on the array.

It is yet another object of the present invention to provide a CCGA substrate extraction process and apparatus which may accommodate various grid arrays and can be automated.

Still other objects and advantages of the invention will in part be obvious and will in part be apparent from the specification.

SUMMARY OF THE INVENTION

The above and other objects and advantages, which will be apparent to one of skill in the art, are achieved in the present invention which is directed to, in a first aspect, an apparatus for removing a casting comprising an electronic package or other type substrate and an array of columns, such as a bonded cast column grid array, extending therefrom from the corresponding openings of a mold. The apparatus includes a frame and a compression plate secured to the frame. The compression plate includes an opening therein for receiving the substrate without interference. The apparatus also includes a graphite or other type mold containing a plurality of openings, preferably more than 2, for casting a corresponding array of columns and bonding the columns to the underside of a substrate when the substrate is disposed on the mold and a stripper plate on the frame for receiving the mold. The stripper plate contains openings therein corresponding to at least some of the openings in the mold. The apparatus further includes an ejector assembly on the frame including a plurality of ejector pins extending therefrom, with at least some of the ejector pins corresponding to openings in the mold and the stripper plate. At least one of the compression plate and the ejector assembly is movable on the frame toward the other to cause at least some of the ejector pins to engage cast columns in the mold openings and push the engaged cast columns and substrate out of the mold.

Preferably, the ejector pins have a length at least as long as the sum of the thickness of the stripper plate at the stripper plate openings and the thickness of the mold at the column casting openings, although the ejector pins may have a length less than the sum of the thickness of the stripper plate at the stripper plate openings and the thickness of the mold at the column casting openings. Preferably, the compression plate opening is larger than the substrate. The apparatus may further include pins for aligning the mold to the stripper plate, with the mold being removable from the stripper plate.

The stripper plate is adapted to be movable relative to the ejector pins away from the ejector assembly after the ejector pins push the cast columns and substrate out of the mold, and preferably the apparatus further includes means for separating the stripper plate and the ejector assembly.

The number of ejector pins in the ejector assembly may be less than, equal to, or greater than the openings in the mold for the cast columns and wherein at least one ejector pin is not able to engage a cast column in the mold openings. The apparatus may further include one or more recesses in the ejector assembly corresponding to the at least one ejector pin not able to engage a cast column in the mold openings to enable the at least one ejector pin to avoid engagement with the mold as the compression plate and the ejector assembly move relatively toward the other. The ejector pins may have heads for bearing against the ejector assembly as at least some of the ejector pins engage cast columns in the mold openings, and the recesses in the ejector assembly may be larger than the ejector pin heads.

Preferably, the compression plate has a periphery surrounding the opening adapted to contact the stripper plate as at least one of the compression plate and the ejector assembly are moved on the frame toward the other, and further includes pins for aligning the mold to the stripper plate, with the pins being in substantial alignment with the compression plate periphery.

In a related aspect, the present invention provides an apparatus for removing a casting comprising an electronic package substrate and an array of cast solder columns having a column pitch of less than 2 mm extending therefrom from the corresponding openings of a mold. The apparatus includes a frame and a removable mold containing a plurality of openings through a thickness thereof for casting a corresponding array of more than 2 solder columns having a column pitch of less than 2 mm and bonding the columns to the underside of an electronic package substrate when the substrate is disposed on the mold. A stripper plate is disposed on the frame for receiving the mold, the stripper plate containing more than 2 openings through a thickness thereof corresponding to at least some of the openings in the mold. An ejector assembly on the frame includes more than 2 ejector pins extending therefrom, with the ejector pins having a length at least as long as the sum of the thickness of the stripper plate at the stripper plate openings and the thickness of the mold at the column casting openings. At least some of the ejector pins corresponding to openings in the mold and the stripper plate. At least one of the mold and the ejector assembly is movable on the frame toward the other to cause at least some of the ejector pins to engage cast columns in the mold openings and push the engaged cast columns and substrate out of the mold. The stripper plate is preferably adapted to be movable relative to the ejector pins away from the ejector assembly after the ejector pins push the cast columns and substrate out of the mold.

In another aspect, the present invention provides a method of removing a casting comprising a substrate and an array of columns extending therefrom from the corresponding openings of a mold. There is provided a compression plate having an opening therein for receiving the substrate without interference, a mold containing a plurality of openings through a thickness thereof for casting a corresponding array of columns and bonding the columns to the underside of a substrate when the substrate is disposed on the mold, and an ejector assembly including a plurality of ejector pins extending therefrom, at least some of the ejector pins corresponding to openings in the mold. The method comprises moving the at least one of the compression plate and the ejector assembly toward the other to cause the substrate to be received within the opening in the compression plate, engaging cast columns in the mold openings with at least some of the ejector pins, and pushing the engaged cast columns and substrate out of the mold and into the opening in the compression plate. The method may further include the step of casting a corresponding array of columns and bonding the columns to the underside of a substrate in the mold.

Preferably, the compression plate has a periphery surrounding the opening and the moving step includes contacting the mold with the compression plate periphery. The method may further include the step of providing a stripper plate for receiving the mold, wherein the stripper plate containing openings through a thickness thereof corresponding to at least some of the openings in the mold. The pushing step (f) then includes moving the ejector pins through a distance at least as long as the sum of the thickness of the stripper plate at the stripper plate openings and the thickness of the mold at the column casting openings. The number of ejector pins provided in the ejector assembly may be less than, equal to or greater than the openings provided in the mold for the cast columns in step (b), and further including the step of retracting at least one ejector pin so that the at least one ejector pin does not engage a cast column in the mold openings.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1:
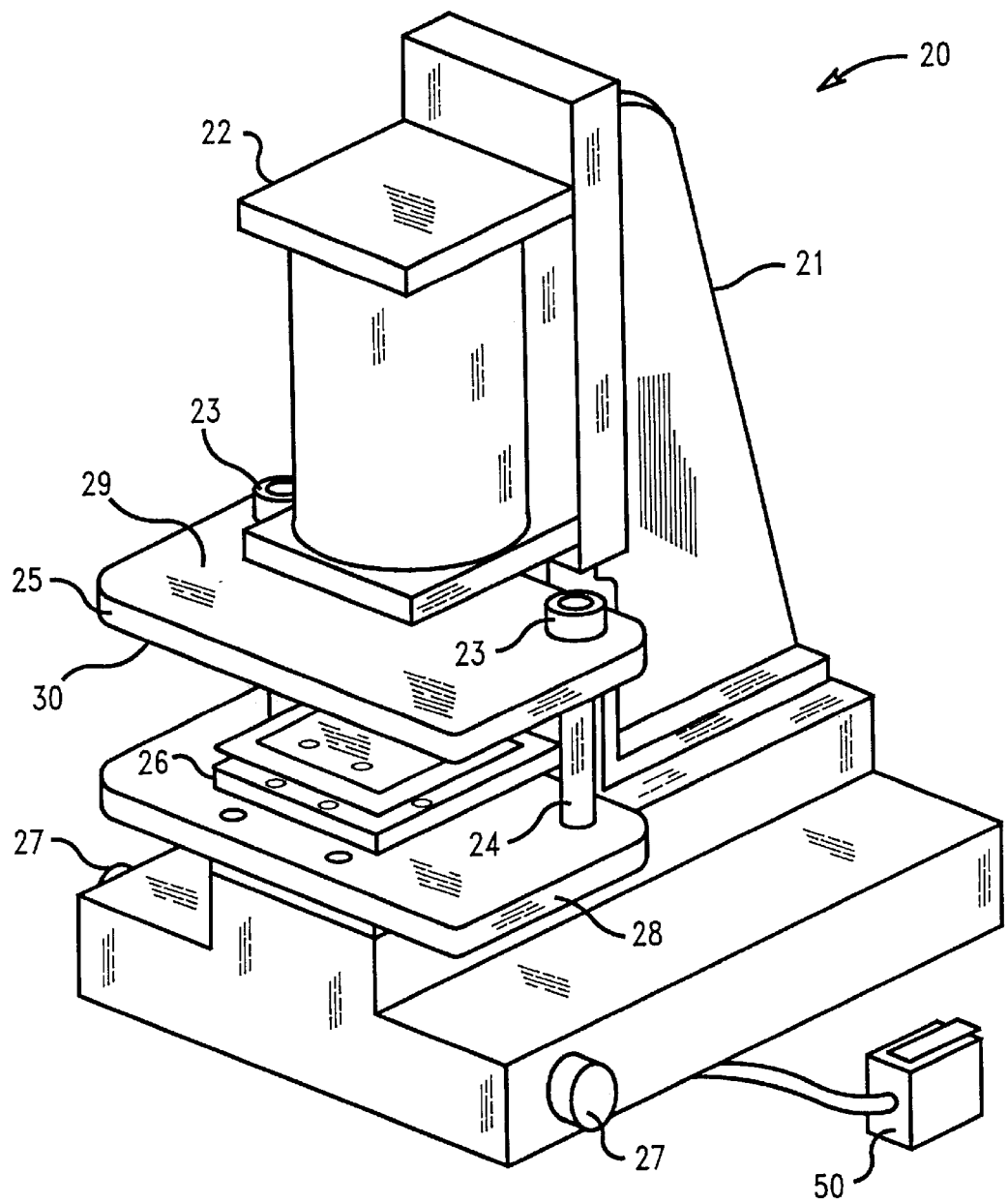
FIG. 1 is a perspective view of the preferred CCGA substrate extraction apparatus of the present invention.
Figure 2:
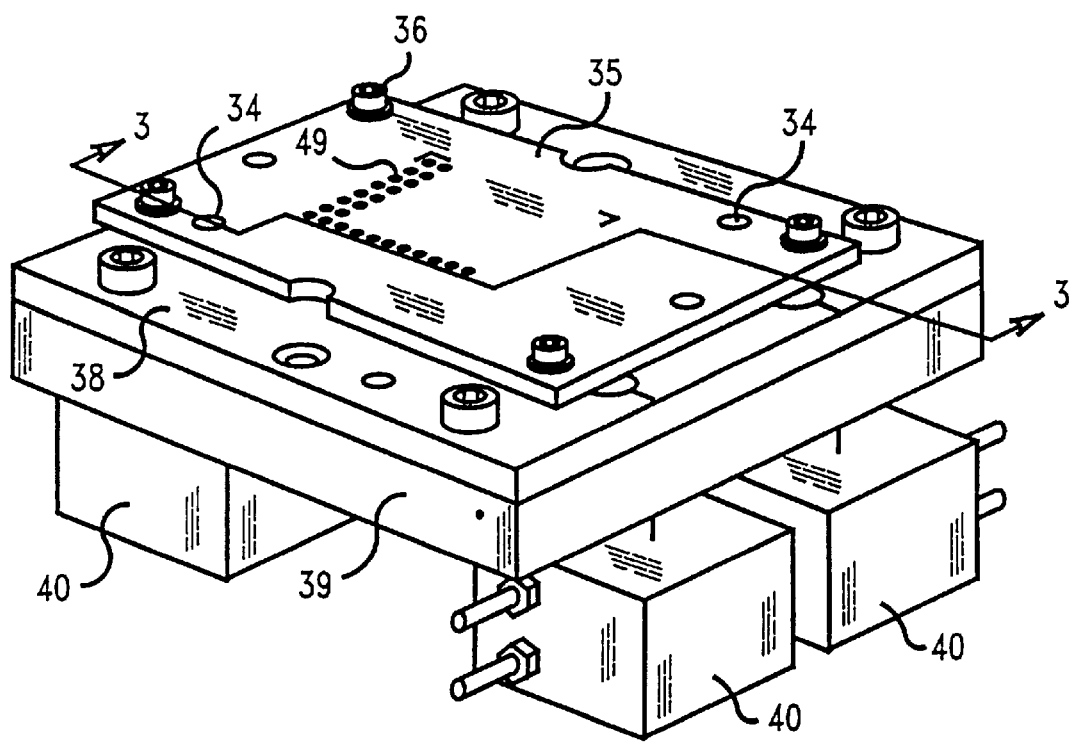
FIG. 2 is a perspective view of the ejector pin assembly portion of the apparatus of FIG. 1.

In describing the preferred embodiment of the present invention, reference will be made herein to FIGS. 1–6 of the drawings in which like numerals refer to like features of the invention. Features of the invention are not necessarily shown to scale in the drawings.

This invention relates generally to a means of extracting one or more multiple feature castings from a mold in a manner that evenly distributes forces on the casting and maintains a very accurate orientation of the direction of force. Additionally this invention minimizes force imposed on the separate mold structure as extraction is undertaken.

The problem of extracting extremely delicate castings, e.g., cast column grid arrays, from very fragile molds is particularly addressed by this invention. These problems are exacerbated by the high force needed to extract these delicate parts due to a minimal draft angle allowance. This minimal draft angle requires a very accurate simultaneous motion so as to avoid binds between the molded features and the mold itself.

In the application example disclosed below, the part to be extracted is an electrical module package. Such an assembled module consists of semiconductor chips and devices mounted to a ceramic carrier substrate which has a solder pin array, typically 2, 3 or more pins or columns, extending downward from the substrate lower surface for the purposes of mounting and electrical connection to a circuit board. The solder pin array is generally cast against the ceramic carrier so as to bond to the metal pads on this carrier. The assembly of carrier and pin array must be withdrawn from graphite mold. These solder pins are extremely delicate, and since they are long and thin require a well controlled method of extraction that does not exert undue force on any one pin. This solder pin array is referred to as a cast column grid array (CGA or CCGA). The mold material is often very fragile due to the high temperature and expansion matching requirements of the CCGA process. The ideal material has shown to be carbon-graphite, normally somewhat fragile but made more so by the high density of machined voids needed to form the solder pin array.

In the preferred embodiment, thin graphite molds with an array of through-holes are first filled with molten solder by injection molding in accordance with the teachings of U.S. Pat. No. 5,244,143, the disclosure of which is hereby incorporated by reference, or close fitting preforms. In either case, an electronic package is aligned with and clamped to the mold. This assembly is then heated to the liquidus temperature of the solder or other casting material. The resulting features assume the shape of the mold through-holes and attach to the electronic package surface by virtue of intermetallic bonding to an array of metallized pads, as disclosed in U.S. Pat. No. 5,718,367, the disclosure of which is hereby incorporated by reference.

Since these mold voids and resulting cast metallic or other material features can have a very high aspect ratio of individual column length-to-width, e.g., 8:1 or more, and a zero clearance fit, separation can be difficult. This is aggravated by the need for a uniform cross section of cast feature, i.e., the columns or pins, thereby limiting the opportunity to incorporate a conventional draft angle. The application of extraction force on each of the possible hundreds of cast pins or other features, while maintaining a perpendicular relationship between the plane of the mold and the extraction motion at one time allows reliable part ejection with reduced possibility of damage or binding to the pins.

As described further below, CCGA column ejector pins are held in a separate precision mechanism, and oriented in an accurate fixed position against a base plate with a retainer plate. Guide pins, protruding from the base plate, locate and guide a stripper plate which has a series of holes that match the ejector pin locations. This plate is held off the base plate with air cylinders or other means acting as springs by a distance equal to the thickness of a filled mold. The ejector pins being located and retained by the retainer plate protrude up through to the top surface of the stripper plate. The filled mold and attached electrical package with solder array or columns attached, is placed on the stripper plate. Locating pins protruding from the stripper plate precisely locate the mold so that the solder column array is aligned with the ejector pin array. A top plate, being guided by an additional set of guide pins and driven by a press, is designed to come in contact with a major portion of the mold surface. A cavity within the plate clears the electronic or other assembly. When force is applied to the top plate by the press, the stripper plate collapses the air springs thus forcing the mold down over the ejector pins which in turn pushes the assembly with columns attached out of the mold. Air pressure is then released from the air springs which allows the stripper plate to remain in the downward position as the top plate returns to its upward and open position. The module, now resting on the tips of the ejector pins by the tips of the solder columns, is now easily removed.

Figure 3:
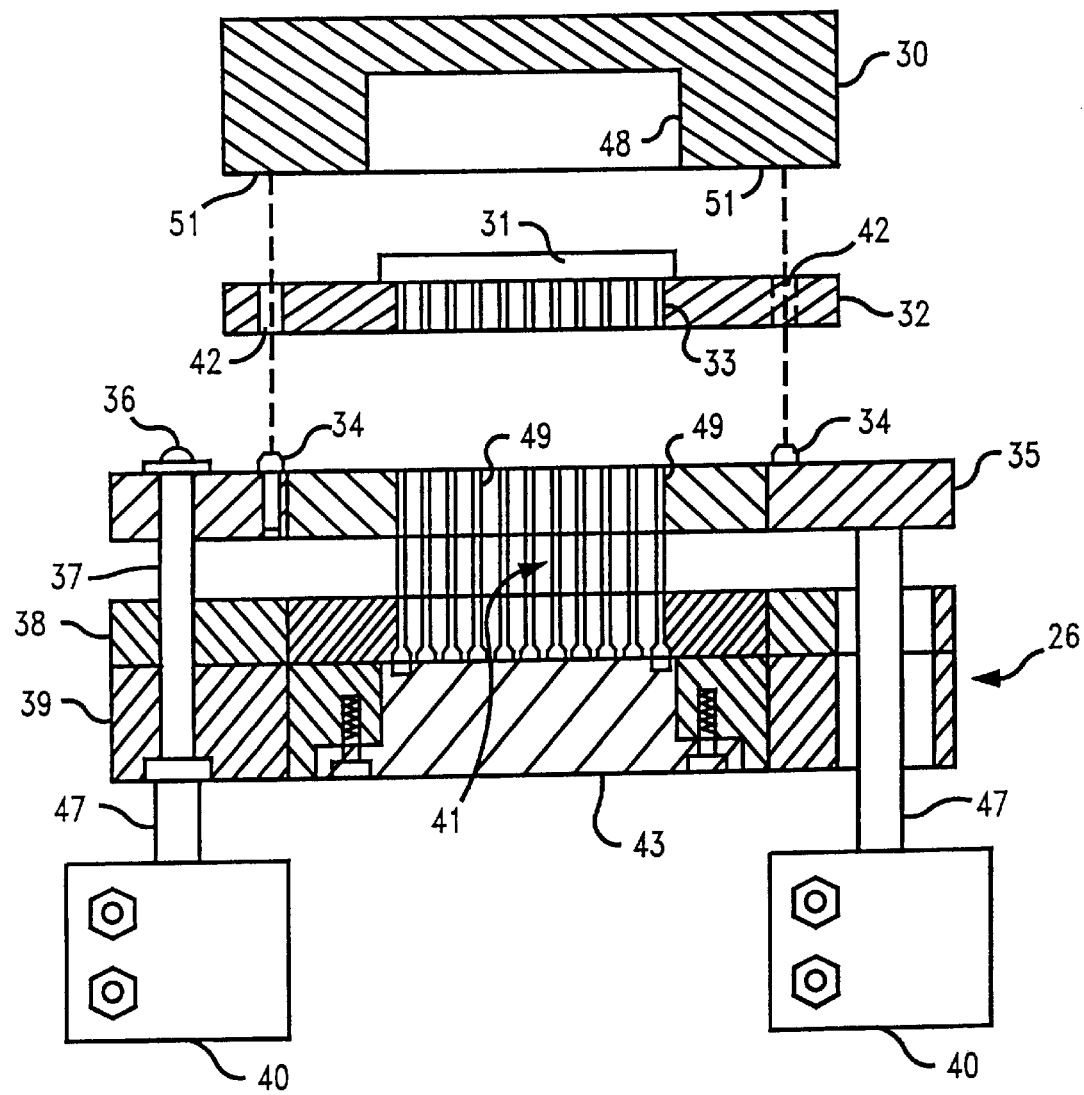
FIG. 3 is a vertical sectional exploded view of the ejector pin assembly along line 3—3 of FIG. 2 showing the ejector pin assembly, compression block, substrate and mold separated from the ejector pin assembly but aligned in their relative positions.

Referring to FIG. 1, the preferred CCGA extraction apparatus of the present invention 20 comprises a pneumatic press 21, a die set assembly 29, and an ejector pin assembly 26. Above the ejector pin assembly 26 is disposed a compression plate or block 30 (FIG. 3). The top shoe 25 of the die set 29 is aligned and guided by the die post 24 and bushings 23 to be movable by air cylinder 22 toward bottom die shoe 28. The press and die set can be any suitably sized commercially available units such as those sold by JT&M Incorporated in Milton, Wis.

In FIG. 3, there is shown in exploded view CCGA mold 32, substrate 31 with downwardly extending cast solder columns 33 and compression block 30 in their relative vertical alignment. The CCGA mold with substrate and compression block are shown separated above the ejector pin assembly 26. The columns are shown in their as-cast, solidified position in the corresponding openings in mold 32. When assembled, the CCGA substrate is received without interference in cavity 48 on the underside of compression plate 30.

Turning back to FIG. 1, the ejector pin assembly 26 is mounted to bottom die shoe 28 and the compression block 30 is mounted to the lower surface of top die shoe 25. The die set assembly 29 is mounted within press 21 as shown in FIG. 1. As seen in FIG. 3, two alignment pins 34 mounted to the stripper plate 35 are equally spaced on either side of ejector pin array 41. Suitable ejector pins are commercially available from Royal Diversified Products in Warren R. I. Two alignment holes 42 in CGA mold are equally spaced on either side of cast column array 33 and coincide to receive alignment pins 34 located on the stripper plate 35. This arrangement aligns the ejector pin array 41 to the solder column array 33 when mold 32 is placed on stripper plate 35. The ejector pins 41 are retained in the retainer plate 38 and protrude through corresponding holes or openings 49 in stripper plate 35. The ejector pins preferably have a length at least as long as the sum of the thickness of stripper plate 35 at the stripper plate openings and the thickness of mold 32 at the column casting openings. Alternatively, the ejector pins may have a length less than sum of the thickness of the stripper plate at the stripper plate openings and the thickness of the mold at the column casting openings. The ejector pin holes in stripper plate 35 are located to coincide with the ejector pins in retainer plate 38 by four vertical guide pins 37 which are supported by base plate 39. A screw and washer 36 are attached to the ends of guide pins 37 to act as a stop for stripper plate 35. Together, base plate 39, retainer plate 38, ejector pin array 41 and the associated securing and alignment means described previously, make up ejector pin assembly 26.

Four air cylinders 40 are mounted to the underside of the bottom die shoe 28 (FIG. 1). Cylinder rods 47 protrude from each of the air cylinders 40 up through ejector pin assembly 26 to make contact with the underside of stripper plate 35. When compressed air is applied to cylinders 40, cylinder rods 47 push stripper plate 35 upwards against stop screws 36, thus applying a constant force to the stripper plate.

Solder columns 33 are attached to substrate 31 by well known processes. The present invention provides a means for removing the substrate with attached columns from the CGA mold without damaging the mold, substrate or solder columns.

Figure 4:
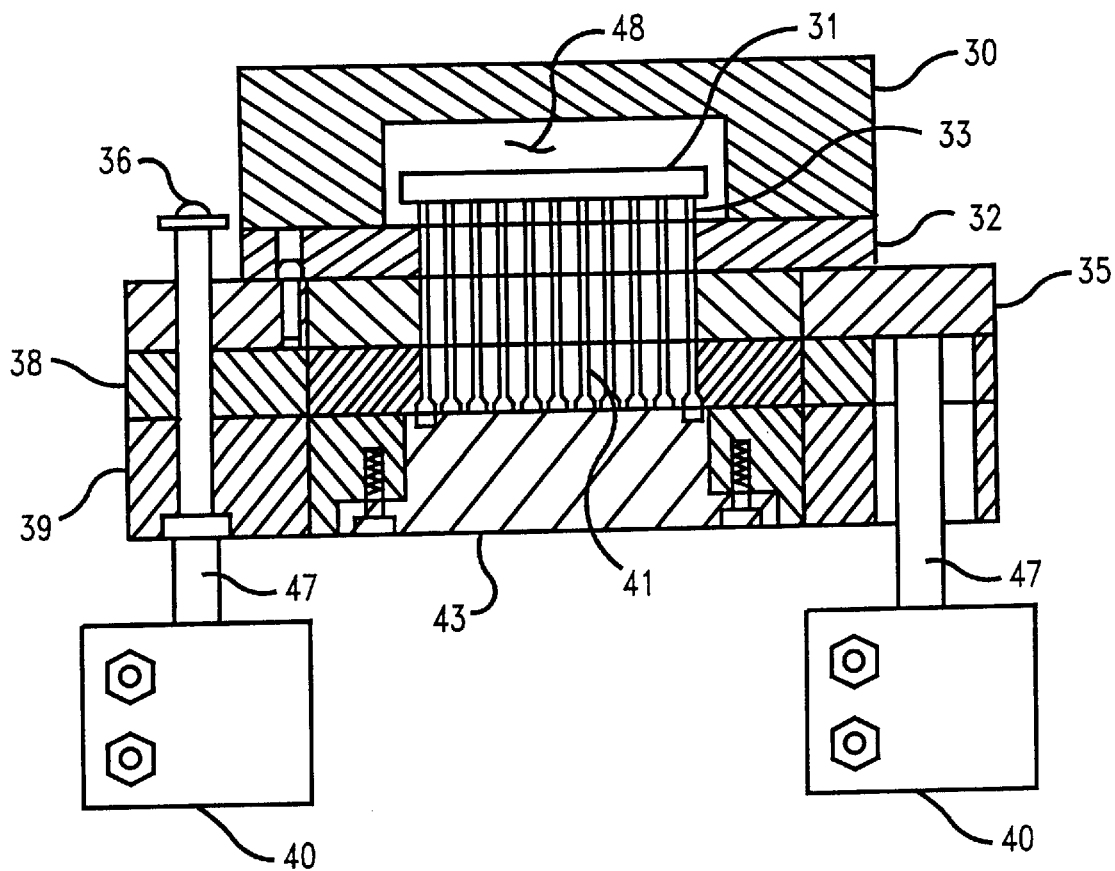
FIG. 4 is a vertical sectional view of the ejector pin assembly along line 3—3 of FIG. 2 showing the ejector pin assembly, compression block, substrate and mold in a compressed position to illustrate the CGA extraction process.

Referring to FIGS. 3 and 4, the extraction process begins by placing mold 32, with substrate 31 and CCGA 33 attached, on stripper plate 35. Alignment pins 34 located on the stripper plate and alignment holes 42 located in the mold register the individual columns in CCGA array 33 with the individual ejector pins 41. The press 21 is activated with the two hand controls 27 to channel compressed air through the press cylinder 22 thus commencing the downward compression stroke of the top die shoe 25 (FIG. 1). Compression block 30, attached to the underside of top die shoe 25, makes contact with mold 32 around the periphery 51 of block 30 and continues to push mold 32 and stripper plate 35 downward until the bottom side of stripper plate 35 makes contact with the upper side of ejector pin retainer plate 38 as illustrated in FIG. 4. As contact is made, the block periphery 51, mold alignment holes 42 and stripper plate alignment pins 34 are in substantial vertical alignment. The ejector pins 41 are held in a fixed position by retainer plate 38 and base plate 39. As such, the tips of ejector pins 41 make contact with the tips of the solder columns 33 during the compression stroke and push the solder columns and substrate 31 smoothly out of mold 32 and into cavity 48 within compression block 30. As they are pushing the solder columns, the ejector pins preferably move relative to mold 32 through a distance of at least the thickness of mold 32 at the column casting openings. Because of the greater size of block opening 48, the block makes no contact with the substrate during extraction and the only contact is by ejector pins 41 against the lower ends of columns 33. This precludes damage to the orientation of columns 33 and the bond between columns 33 and substrate 31.

Prior to releasing the press controls 27 to allow the press cylinders to retract, a foot switch 50 (FIG. 1) is activated to release air pressure being applied to the four cylinders 40, thereby removing the upward force being applied by the cylinders to stripper plate 35. This is done to prevent stripper plate 35 from being pushed up to its non-compressed position when compression block 30 moves upward to its open position. This action allows the extracted substrate 31 and connected CCGA 33 to remain on the tips of the ejector pins 41 for easy removal and prevents CCGA array 33 from plugging back down into the mold.

After the press is opened and substrate 31 is removed, the foot switch is released allowing air pressure in cylinders 40 to push stripper plate 35 up against the stop screws 36, thereby completing the extraction cycle.

CCGA column quantity and location varies from product to product, thus creating the need to easily adjust the ejector pin 41 configuration to match the CCGA product. The two basic column-to-column pitches are 1 mm and 1.27 mm, with typical individual column diameters being 0.5 mm and individual column lengths being 3 mm. A dedicated ejector pin assembly 26 may be created corresponding to each CCGA pitch. A typical diameter for each ejector pin is 0.43 mm while a typical length for each ejector pin is 10 mm. Each assembly is configured with sufficient ejector pins to handle the product with the largest number of columns. For example, an ejector pin assembly may have an array size of 40×40 pins. Accordingly, it is necessary to disable selected ejector pins when extracting parts with a different column count.

Figure 5:
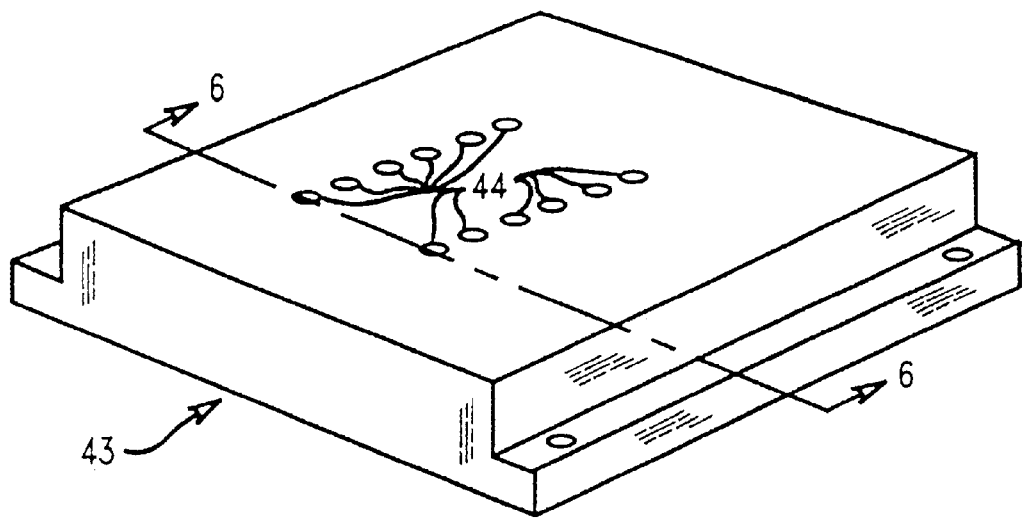
FIG. 5 is a perspective view of the configuration plate designed to disable selected ejector pins.
Figure 6:
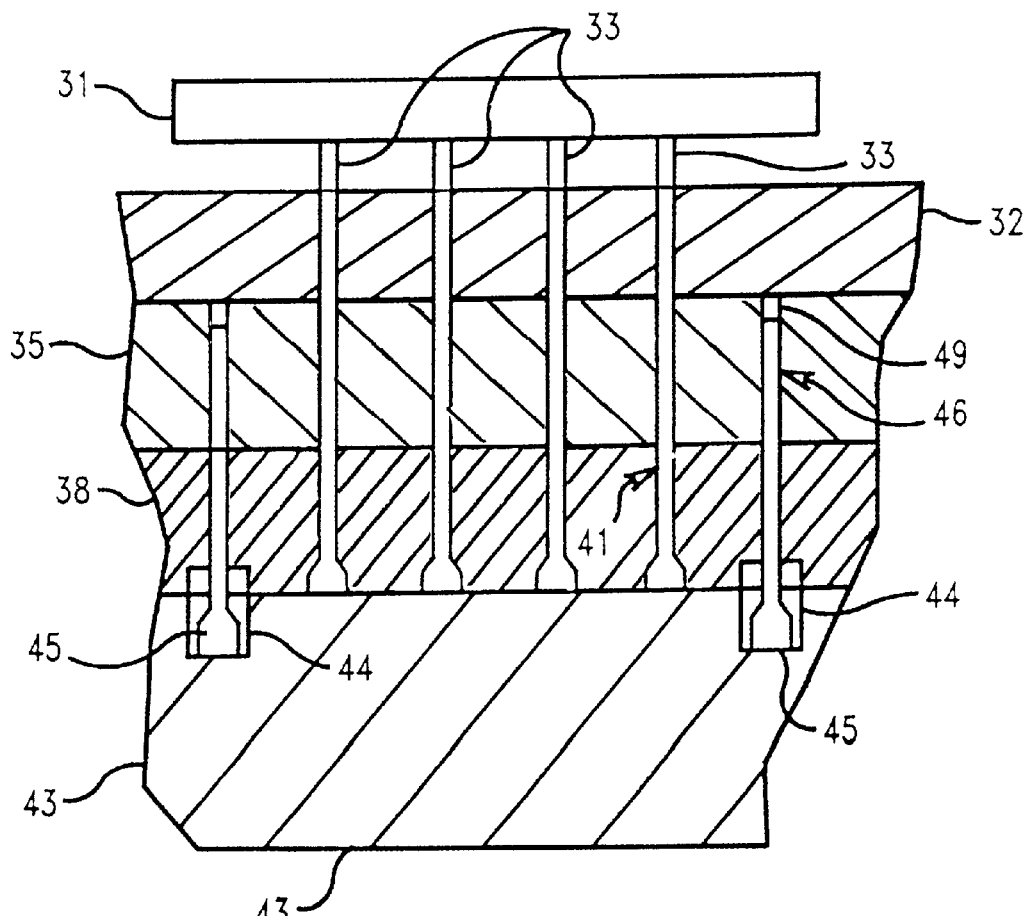
FIGS. 6 and 6a are alternate embodiments of a vertical sectional view through the ejector pins sectioned along line 6—6 of FIG. 5 to illustrate the operation of the configuration plate to disable selected ejector pins.

This may be accomplished by the apparatus shown in FIGS. 5 and 6. Configuration plate 43 is attached to the underside of the base plate 39. Ejector pins 41, 46 are received in a sliding fit within the corresponding supporting openings in ejector pin retainer plate 38. Because mold 32 has fewer openings for CCGA columns 33 than the total number of ejector pins 41, 46 as shown, only ejector pins 41 are needed to press CCGA columns 33 out of mold 32. Each configuration plate has a distinct set of closed, flat-bottomed holes or recesses 44 that align with the individual ejector pins 46 along the perimeter of the array which are required to be disabled. The holes or recesses 44 are sized large enough in diameter to clear the ejector pin heads 45 without side wall interference. The CCGA mold 32 has a distinct set of CCGA holes that match each product type.

Figure 6A:
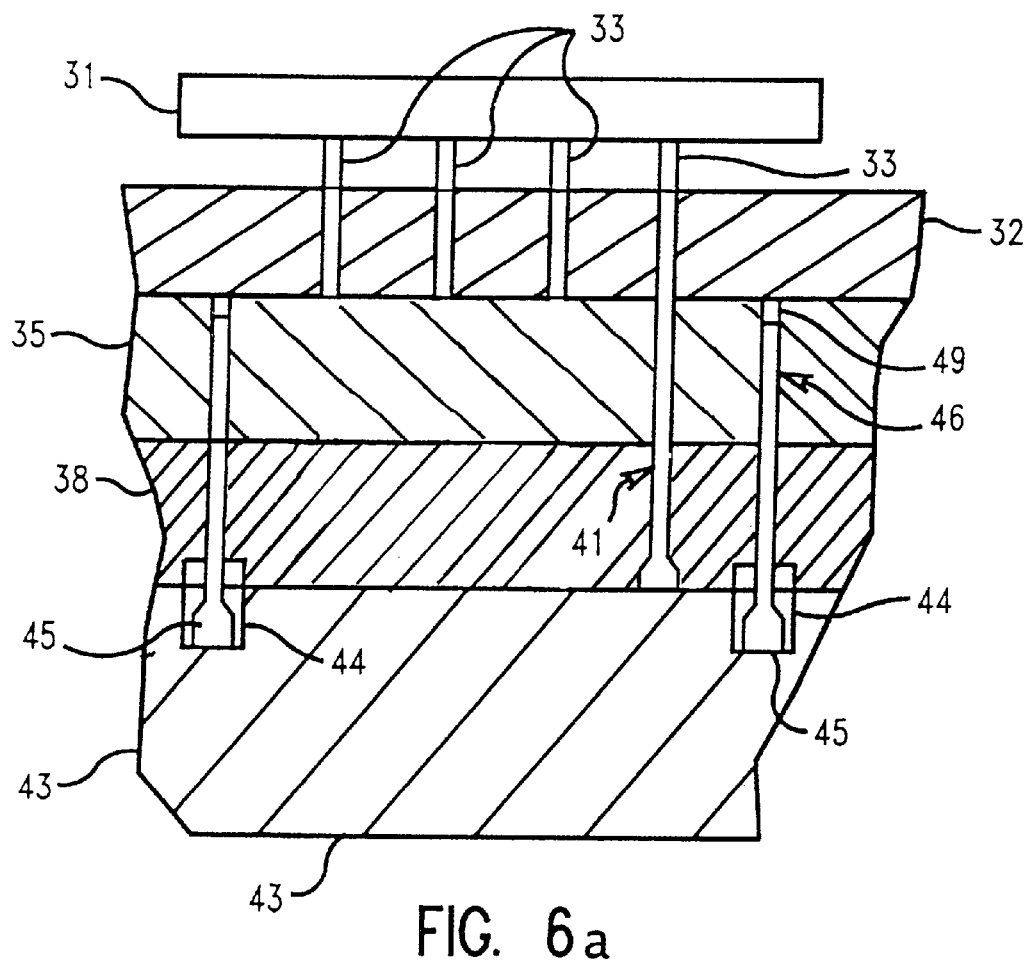

During the CCGA extraction process, the CGA mold 32 is pressed against stripper plate 35 and travels downward until stripper plate 35 makes contact with the ejector pin retainer plate 38. During this action, the ejector pins 41 that are located over flat bottom holes 44 are retracted by either falling in the hole by their own weight or being pushed in the hole by CCGA mold 32. The ejector pins 41 in the center portion of the array over flat bottom holes 44 are pushed against configuration plate 43 by the substrate 31 solder column 33. The continued downward stroke of compression block 30 forces the CCGA mold 32 down, thereby separating the substrate and CCGA from the mold. The aforedescribed arrangement for retraction of ejector pins may be utilized even if the number of ejector pins is less than or equal to the number of openings provided in the mold for the cast columns. FIG. 6a is indentical to FIG. 6 except that it shows a fewer number of ejector pins 41 than openings in mold 32.

The method and apparatus of the present invention provide a precision mechanism that works with separate molds/fillings and is not subject to the molding process itself. An important difference in the present invention as compared to the prior art is that the ejection pin array and the mold alignment means are incorporated into the extract mechanism only, permitting lower cost molds, the possibility of close tolerance injection filling of the (separate) mold, and the enabling of a re-cast transfer process with desirable lower thermal mass. The CCGA extraction apparatus of the present invention permits the ejector pins to protrude all the way through the mold without causing damage to the mold or product. Additionally, the extractor is easily adaptable to various mold configurations, minimizing changeover time and equipment duplication.

The present invention is especially suited to extraction of an array of cast features, for example CCGA and other types of interconnect pins having a pin-to-pin spacing or pitch of less than 2 mm that have been bonded or otherwise attached to at least one other discrete part while remaining in the mold for alignment purposes. The preferred embodiment is applied in the manufacture of electrical and microelectronic packages, but could be equally effective in other processes or products with similar physical requirements.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. An apparatus for removing a casting comprising a substrate and an array of columns extending therefrom from the corresponding openings of a mold comprising:

a frame;

a compression plate secured to said frame, said compression plate including an opening therein for receiving said substrate without interference;

a mold containing a plurality of openings for casting a corresponding array of columns and bonding said columns to the underside of a substrate when said substrate is disposed on said mold;

a stripper plate on said frame for receiving said mold, said stripper plate containing openings therein corresponding to at least some of the openings in said mold;

an ejector assembly on said frame including a plurality of ejector pins extending therefrom, at least some of said ejector pins corresponding to openings in said mold and said stripper plate, at least one of said compression plate and said ejector assembly being movable on said frame toward the other to cause at least some of said ejector pins to engage cast columns in the mold openings and push the engaged cast columns and substrate out of said mold.

2. The apparatus of claim 1 wherein said ejector pins have a length at least as long as the sum of the thickness of said stripper plate at the stripper plate openings and the thickness of said mold at the column casting openings.

3. The apparatus of claim 1 wherein said ejector pins have a length less than the sum of the thickness of said stripper plate at the stripper plate openings and the thickness of said mold at the column casting openings.

4. The apparatus of claim 1 wherein said compression plate opening is larger than said substrate.

5. The apparatus of claim 1 further including pins for aligning said mold to said stripper plate, said mold being removable from said stripper plate.

6. The apparatus of claim 1 wherein said stripper plate is adapted to be movable relative to said ejector pins away from said ejector assembly after said ejector pins push said cast columns and substrate out of said mold.

7. The apparatus of claim 6 further including means for separating said stripper plate and said ejector assembly.

8. The apparatus of claim 1 wherein said mold contains more than 2 cast column openings.

9. The apparatus of claim 1 wherein the number of ejector pins in said ejector assembly is greater than the openings in said mold for said cast columns and wherein at least one ejector pin is not able to engage a cast column in the mold openings.

10. The apparatus of claim 1 wherein the number of ejector pins in said ejector assembly is less than or equal to the openings in said mold for said cast columns and wherein at least one ejector pin is not able to engage a cast column in the mold openings.

11. The apparatus of claim 9 further including one or more recesses in said ejector assembly corresponding to the at least one ejector pin not able to engage a cast column in the mold openings to enable said at least one ejector pin to avoid engagement with said mold as said compression plate and said ejector assembly move relatively toward the other.

12. The apparatus of claim 10 further including one or more recesses in said ejector assembly corresponding to the at least one ejector pin not able to engage a cast column in the mold openings to enable said at least one ejector pin to avoid engagement with said mold as said compression plate and said ejector assembly move relatively toward the other.

13. The apparatus of claim 11 wherein said ejector pins have heads for bearing against said ejector assembly as at least some of said ejector pins engage cast columns in the mold openings, and wherein said one or more recesses in said ejector assembly is larger than the ejector pin heads.

14. The apparatus of claim 1 wherein said mold comprises graphite, said substrate comprises an electronic package, and said columns comprise a cast column grid array bonded to said substrate.

15. The apparatus of claim 1 wherein said compression plate has a periphery surrounding said opening adapted to contact said stripper plate as at least one of said compression plate and said ejector assembly are moved on said frame toward the other.

16. The apparatus of claim 15 further including pins for aligning said mold to said stripper plate, said pins being in substantial alignment with the compression plate periphery.

17. An apparatus for removing a casting comprising a electronic package substrate and an array of cast solder columns having a column pitch of less than 2 mm extending therefrom from the corresponding openings of a mold comprising:

a frame;

a removable mold containing a plurality of openings through a thickness thereof for casting a corresponding array of more than 2 solder columns having a column pitch of less than 2 mm and bonding said columns to the underside of an electronic package substrate when said substrate is disposed on said mold;

a stripper plate on said frame for receiving said mold, said stripper plate containing more than 2 openings through a thickness thereof corresponding to at least some of the openings in said mold;

an ejector assembly on said frame including more than 2 ejector pins extending therefrom, said ejector pins having a length at least as long as the sum of the thickness of said stripper plate at the stripper plate openings and the thickness of said mold at the column casting openings, at least some of said ejector pins corresponding to openings in said mold and said stripper plate, at least one of said mold and said ejector assembly being movable on said frame toward the other to cause at least some of said ejector pins to engage cast columns in the mold openings and push the engaged cast columns and substrate out of said mold.

18. The apparatus of claim 17 wherein said stripper plate is adapted to be movable relative to said ejector pins away from said ejector assembly after said ejector pins push said cast columns and substrate out of said mold.

19. A method of removing a casting comprising a substrate and an array of columns extending therefrom from the corresponding openings of a mold comprising the steps of:

a) providing a compression plate having an opening therein for receiving said substrate without interference;

b) providing a mold containing a plurality of openings through a thickness thereof for casting a corresponding array of columns and bonding said columns to the underside of a substrate when said substrate is disposed on said mold;

c) providing an ejector assembly including a plurality of ejector pins extending therefrom, at least some of said ejector pins corresponding to openings in said mold;

d) moving said at least one of said compression plate and said ejector assembly toward the other to cause said substrate to be received within said opening in said compression plate;

e) engaging cast columns in the mold openings with at least some of said ejector pins; and f) pushing the engaged cast columns and substrate out of said mold and into said opening in said compression plate.

20. The method of claim 19 further including the step of casting a corresponding array of columns and bonding said columns to the underside of a substrate in said mold.

21. The method of claim 19 wherein said compression plate has a periphery surrounding said opening and wherein step (d) includes contacting said mold with the compression plate periphery.

22. The method of claim 19 further including the step of providing a stripper plate for receiving said mold, said stripper plate containing openings through a thickness thereof corresponding to at least some of the openings in said mold and wherein step (f) includes moving said ejector pins through a distance at least as long as the sum of the thickness of said stripper plate at the stripper plate openings and the thickness of said mold at the column casting openings.

23. The method of claim 19 wherein the number of ejector pins provided in step (c) in said ejector assembly is greater than the openings provided in said mold for said cast columns in step (b), and further including the step of retracting at least one ejector pin so that said at least one ejector pin does not engage a cast column in the mold openings.

24. The method of claim 19 wherein the number of ejector pins provided in step (c) in said ejector assembly is less than or equal to the openings provided in said mold for said cast columns in step (b), and further including the step of retracting at least one ejector pin so that said at least one ejector pin does not engage a cast column in the mold openings.

* * * * *